(12) United States Patent
Selvamanickam (10) Patent No.: US 10,818,416 B2
(45) Date of Patent: Oct. 27, 2020

(54) SUPERCONDUCTOR WITH IMPROVED FLUX PINNING AT LOW TEMPERATURES

(71) Applicant: The University of Houston System, Houston, TX (US)

(72) Inventor: Venkat Selvamanickam, Houston, TX (US)

(73) Assignee: The University of Houston System, Houston, TX (US)

( * ) Notice: Subject to any disclaimer, the term of this patent is extended or adjusted under 35 U.S.C. 154(b) by 1793 days.

(21) Appl. No.: 14/242,587

(22) Filed: Apr. 1, 2014

(65) Prior Publication Data

US 2016/0172080 A1    Jun. 16, 2016

Related U.S. Application Data

(60) Provisional application No. 61/807,142, filed on Apr. 1, 2013.

(51) Int. Cl.
| | | |
|---|---|---|
| *H01B 12/02* | (2006.01) | |
| *H01L 39/24* | (2006.01) | |
| *H01L 39/14* | (2006.01) | |
| *H01B 1/02* | (2006.01) | |
| *H01B 1/08* | (2006.01) | |

(52) U.S. Cl.
CPC ............ *H01B 12/02* (2013.01); *H01B 1/02* (2013.01); *H01B 1/08* (2013.01); *H01L 39/143* (2013.01); *H01L 39/2483* (2013.01)

(58) Field of Classification Search
CPC .. H01B 12/02; H01B 1/02; H01B 1/08; H01L 39/143

USPC ................................................. 505/230, 234
See application file for complete search history.

(56) References Cited

U.S. PATENT DOCUMENTS

| | | | | |
|---|---|---|---|---|
| 5,122,505 A | * | 6/1992 | Gusman | .................. C01B 13/18 252/519.15 |
| 6,569,811 B1 | | 5/2003 | Shi | |
| 2003/0205403 A1 | | 11/2003 | Tanaka et al. | |
| 2005/0159298 A1 | * | 7/2005 | Rupich | ............... H01L 39/2425 502/100 |
| 2006/0094603 A1 | * | 5/2006 | Li | ....................... C23C 18/1216 505/445 |

OTHER PUBLICATIONS

Aytug et al., "Enhanced flux pinning in MOCVD-YBCO films through Zr additions: systematic feasibility studies" Supercond. Sci. Technol. 23 (2010).*

(Continued)

*Primary Examiner* — Paul A Wartalowicz
(74) *Attorney, Agent, or Firm* — Blank Rome LLP (57) ABSTRACT

A REBCO superconductor tape that can achieve a lift factor greater than or equal to approximately 3.0 or 4.0 in an approximately 3 T magnetic field applied perpendicular to a REBCO tape at approximately 30 K. In an embodiment, the REBCO superconductor tape can include a critical current density less than or equal to approximately 4.2 MA/cm$^2$ at 77 K in the absence of an external magnetic field. In another embodiment, the REBCO superconductor tape can include a critical current density greater than or equal to approximately 12 MA/cm$^2$ at approximately 30 K in a magnetic field of approximately 3 T having an orientation parallel to a c-axis.

21 Claims, 11 Drawing Sheets

(56) References Cited

OTHER PUBLICATIONS

Selvamanickam et al., "Progress in SuperPower's 2G HTS Wire Development and Manufacturing." 2010 DOE Advanced Cables and Conductors Peer Review (2010).*

Selvamanickam et al., "Enhanced critical currents in (Gd,Y)Ba2Cu0x superconducting tapes with high levels of Zr addition." Supercond. Sci. Technol. 26, Jan. 21, 2013 (Jan. 21, 2013), Fig 16, 17; abstract; section 2. Experimental details.

Selvamanickam et al., "Progress in development of MOCVD-based coated conductors." Applied Superconductivity Conference Portland, OR, Oct. 12, 2012 (Oct. 12, 2012), slide 4 [online] URL= <http://www.superpower-inc.com/system/files/2012_1 008+Selvamanickam+ASC+2012+finai+PRES _ O.pdf>.

International Search Report and Written Opinion dated Dec. 4, 2014, 10 pages.

Selvamanickam et al., "The low-temperature, high-magnetic-field critical current characteristics of Zr-added (Gd, Y) Ba2Cu3Ox superconducting tapes," Superconductor Science and Technology, IOP Publishing, Oct. 26, 2012, vol. 25, p. 1-p. 7.

Office Action received in corresponding Japanese Patent Application No. 2016-505620, dated Nov. 11, 2016.

Abrahamsen, A. B., et al., "Feasibility study of 5 MW superconducting wind turbine generator," Physica C.471, 1464-69 (2011).

Blatter, G., et al., "Vortices in high-temperature superconductors," Rev. Mod. Phys. 66 1125 (1994).

Braccini, V., et al., "Properties of recent IBAD-MOCVD Coated Conductors relevant to their high field, low temperature magnet use," Superconductor Science and Technology 24, 035001 (2011).

Civale, L., "Vortex pinning and creep in high-temperature superconductors with columnar defects," Supercond. Sci. Technol. 10, A11 (1997).

Goyal, A., et al., "High critical current density superconducting tapes by epitaxial deposition of YBa2Cu3O x thick films on biaxially textured metals," AIP Publishing, Applied Physics Letters 69, 1795 (1996), 4 pages.

Gyorgy, E.M., et al., "Anisotropic critical currents in Ba2YCu3O7 analyzed using an extended bean model," Appl. Phys. Lett. 55, 283 (1989).

Horde, T., "The crossover from the vortex glass to the Bose glass in nanostructured YBa2Cu3O7-x films," Appl. Phys. Lett. 82, 182511 (2008).

Huijbregtse, J. M., et al., "Vortex pinning by natural defects in thin films of YBa2Cu3O7-δ," Supercond. Sci. Technol. 15, 395 (2002).

Iijima, Yasuhiro, et al., "Biaxially Aligned YBa2Cu3O7-X Thin Film Tapes," Elsevier Science Publishers B.V., Physica C 185-189 (1991), 2 pages.

Kang, S., et al., "High-Performance High-Tc Superconducting Wires," Science 311, 1911 (2006).

Kummeth, P., et al., "Development of synchronous machines with HTS rotor," Physica C.426, 1358-64 (2005).

MacManus-Driscoll, J. L., et al., "Strongly Enhanced Current Densities in Superconducting Coated Conductors of YBa2Cu3O7-x+BaZrO3," Nature Materials 3, 439 (2004).

Mukaida, M., et al., "Critical Current Density Enhancement around a Matching Field in ErBa2Cu3O7-δ Films with ElaZrO3 Nano-Rods," Jpn. J. Appl. Phys. 44, L952 (2005).

Pan, V. M., et al., "Dimensional crossovers and related flux line-lattice states in YBa2Cu3O7-δ," Physica C 279, 18 (1997).

Selvamanickam, V., et al., "Enhanced critical currents in high levels of Zr-added (Gd,Y)Ba2Cu3Ox superconducting tapes," Supercond. Sci. Technol. 26, 035006 (2013).

Selvamanickam, V., et al., "High Performance 2G Wires: From R&D to Pilot Scale Manufacturing," IEEE Transactions on Applied Superconductivity, vol. 19, No. 3, 2009, 6 pages.

Selvamanickam, V., et al., "Influence of Zr and Ce Doping on Electromagnetic Properties of (Gd,Y)—Ba—Cu—O Superconducting Tapes Fabricated by Metal Organic Chemical Vapor Deposition," Physica C 469, 2037 (2009).

van der Beek, C. J., "Strong pinning in high-temperature superconducting films," Phys. Rev. B 66, 024523 (2003).

Varanasi, C., et al., "Thick YBa2Cu3O7-x + BaSnO3 films with enhanced critical current density at high magnetic fields," Appl. Phys. Lett. 93 092501, (2008).

Wu, X. D., et al., "Properties of YBa2Cu3O7 thick firms on flexible buffered metallic substrates," AIP Publishing, Applied Physics Letters 67, 2397 (1995), 4 pages.

Yamada, Y., et al., "Epitaxial nanostructure and defects effective for pinning in Y(RE)Ba2Cu3O7-x coated conductors," Appl. Phys. Lett. 87, 132502 (2005).

* cited by examiner

FIG. 1

[Prior Art]

FIG. 2

[Prior Art]

SUPERCONDUCTOR WITH IMPROVED FLUX PINNING AT LOW TEMPERATURES

CROSS-REFERENCES TO RELATED APPLICATIONS

This application claims priority to U.S. provisional application No. 61/807,142, filed on Apr. 1, 2013, which is herein incorporated by reference in its entirety.

GOVERNMENT SPONSORSHIP

Advanced Research Projects Agency-Energy (ARPA-E), award DE-AR0000196

BACKGROUND

Several materials systems are being developed to solve the looming problems associated with energy generation, transmission, conversion, storage, and use. Superconductors are a unique system that provides a solution across a broad spectrum of energy problems. Superconductors enable high efficiencies in generators, power transmission cables, motors, transformers and energy storage. Furthermore, superconductors transcend applications beyond energy to medicine, particle physics, communications, and transportation.

Superconducting tapes are becoming more and more popular. This is in part due to successful fabrication techniques that create epitaxial, single-crystal-like thin films on polycrystalline substrates (Y. Iijima, et al., Physica C 185, 1959 (1991); X. D. Wu, et al., Appl. Phys. Lett. 67, 2397 (1995); A. Goyal, et. al., Appl. Phys. Lett. 69 (1996) p. 1795; V. Selvamanickam et al., "High Performance 2G wire: From R&D to Pilot-scale Manufacturing," IEEE Trans. Appl. Supercond. 19, 3225 (2009)). In this technique, a thin film of materials having a rock salt crystal structure (e.g., MgO) is deposited by ion-beam assisted deposition over flexible, polycrystalline substrates. Superconducting films that are processed by this technique exhibit critical current densities comparable to that achieved in epitaxial films grown on single crystal substrates. Using this technique, several institutions have demonstrated pilot-scale manufacturing of superconducting composite tapes. Remarkably, single crystal-like epitaxial films are now being manufactured at lengths exceeding 1 km using a polycrystalline substrate base.

Figure 1:
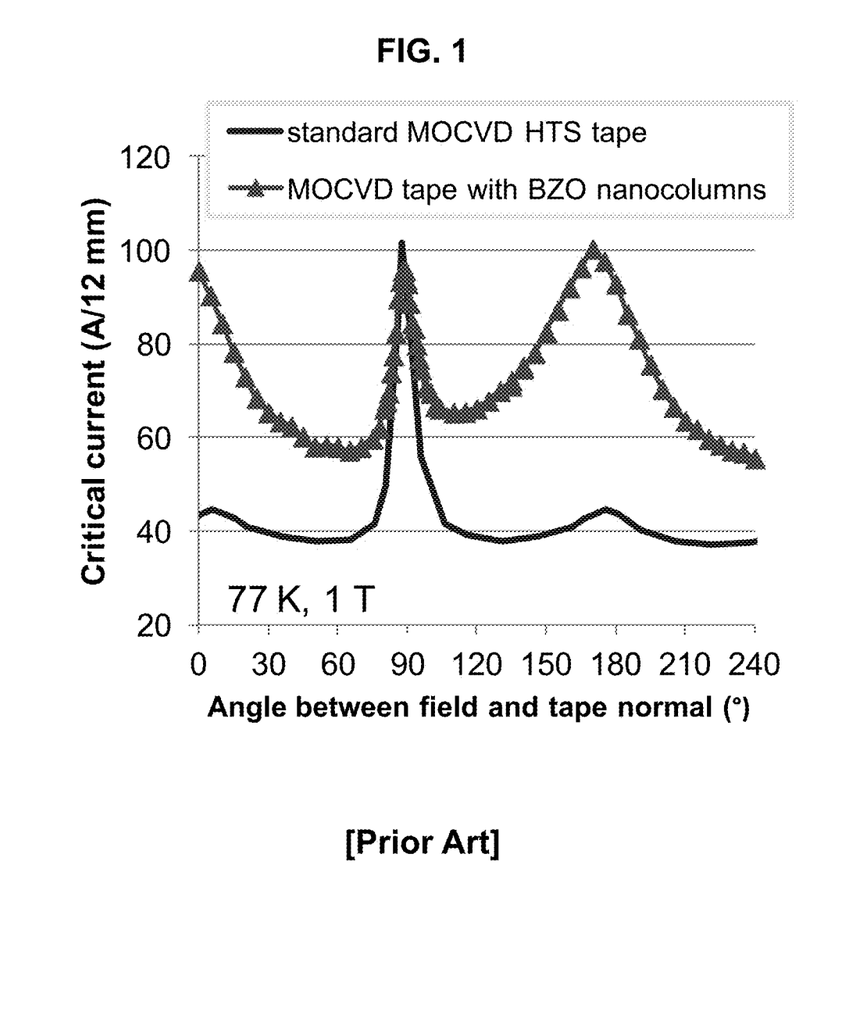
FIG. 1 illustrates critical current density as a function of an angle between a magnetic field and substrate tape normal for an MOCVD HTS tape and BZO-doped MOCVD tape.

One significant drawback of superconductors is that their ability to carry current rapidly diminishes when the superconductor is exposed to a magnetic field. Thus, in certain applications such as wind generators, motors, high-field magnets, or energy storage systems, superconductors cannot achieve their full current carrying potential because the generator coil is exposed to magnetic fields at a few Tesla. Another drawback is that in high-temperature superconductors (HTS), superconductivity is localized within the Cu—O planes (E. M. Gyorgy, et. al., "Anisotropic critical currents in $Ba_2YCu_3O_7$ analyzed using an extended bean model" Appl. Phys. Lett. 55, 283 (1989)). This phenomenon creates an anisotropic effect in the superconductor's current carrying capability. For example, FIG. 1 illustrates the anisotropy in critical current of a standard HTS tape made by a process called metal organic chemical vapor deposition (MOCVD). The anisotropic effect can be visualized by aligning a magnetic field at different angles to the HTS film surface. The critical current drops rapidly as the field is moved away from the film surface. Furthermore, the critical current reaches a low value when the field is oriented at a 0° angle from the tape normal (i.e. perpendicular to the tape surface). The critical current at this field orientation is the limiting value in the performance of coils that are constructed with these standard tapes.

Over the last decade research has been focused on improving the current carrying capabilities of superconductors exposed to a magnetic field. Significant research has been focused on improving flux pinning in superconductors. Flux pinning is a phenomenon of type II high-temperature superconductors (HTS), which unlike Type I superconductors, have two critical fields that allow partial penetration of a magnetic field. Above the lower critical field, 2G HTS tapes allow magnetic flux to penetrate the superconducting film in quantized packets surrounded by a superconducting current vortex through flux tubes. At lower currents, the flux tubes are pinned in place. This pinning phenomenon can substantially reduce any flux creeping that can create undesirable electrical resistance in the superconductor. Thus, improvements to flux pinning can minimize the above drawbacks that a superconductor experiences in a magnetic field (e.g., anisotropy, lower critical current, etc.).

The most explored strategy to improve flux pinning has been to introduce defects into the superconductor that are comparable in lateral dimensions with superconducting coherence length since the lateral size of the penetrated flux lines is equal to twice the value of the coherence length. In 2G HTS tapes, defects include oxygen vacancies, threading dislocations, twin planes, impurity atoms, irradiation-induced columnar defects, and nanostructured inclusions, of various composition and structure (V. M. Pan, et al., "Dimensional crossovers and related flux line-lattice states in $YBa_2Cu_3O_7$-δ," Physica C 279, 18 (1997); J. M. Huijbregtse, et al., "Vortex pinning by natural defects in thin films of $YBa_2Cu_3O_7$-δ," Supercond. Sci. Technol. 15, 395 (2002); G. Blatter, et al., "Vortices in high-temperature superconductors," Rev. Mod. Phys. 66 1125 (1994); L. Civale, "Vortex pinning and creep in high-temperature superconductors with columnar defects," Supercond. Sci. Technol. 10, A11 (1997); C. J. van der Beek, et al., "Strong pinning in high-temperature superconducting films," Phys. Rev. B 66, 024523 (2003)). Particularly, irradiation-induced columnar defects have shown great potential for improving flux pinning. Research groups have recently developed an approach to introduce columnar defects by chemically doping a superconducting film with $BaZrO_3$ (BZO) or $BaSnO_3$ (BSO) (J. L. Macmanus-Driscoll et al., "Strongly enhanced current densities in superconducting coated conductors of YBa2Cu3O7-x+BaZrO3," Nature Materials 3, 439 (2004); S. Kang et al. "High-Performance High-Tc Superconducting Wires," Science 311, 1911 (2006); Y. Yamada et al., "Epitaxial nanostructure and defects effective for pinning in Y(RE)$Ba_2Cu_3$O7-x coated conductors," Appl. Phys. Lett. 87, 132502 (2005); C. Varanasi, et al., "Thick $YBa_2Cu_3O_7$-x+$BaSnO_3$ films with enhanced critical current density at high magnetic fields," Appl. Phys. Lett. 93 092501, (2008)). The BZO and BSO inclusions formed nano-sized columns (about 5 nm in diameter) by a self-assembly process during superconductor film growth, which significantly improved the film's pinning strength (S. Kang et al. "High-Performance High-Tc Superconducting Wires," Science 311, 1911 (2006); Y. Yamada et al., "Epitaxial nanostructure and defects effective for pinning in Y(RE)$Ba_2Cu_3$O7-x coated conductors," Appl. Phys. Lett. 87, 132502 (2005); C. Varanasi, et al., "Thick $YBa_2Cu_3O_7$-x+$BaSnO_3$ films with enhanced critical current density at high magnetic fields," Appl. Phys. Lett. 93 092501, (2008); T. Horide, et al., "The crossover from the vortex glass to the Bose glass in nanostructured YBa$_2$Cu$_3$O$_7$-x films," Appl. Phys. Lett. 82, 182511 (2008); M. Mukaida, et al., "Critical Current Density Enhancement around a Matching Field in ErBa$_2$Cu$_3$O$_7$-δ Films with BaZrO$_3$ Nano-Rods," Jpn. J. Appl. Phys. 44, L952 (2005)).

Figure 2:
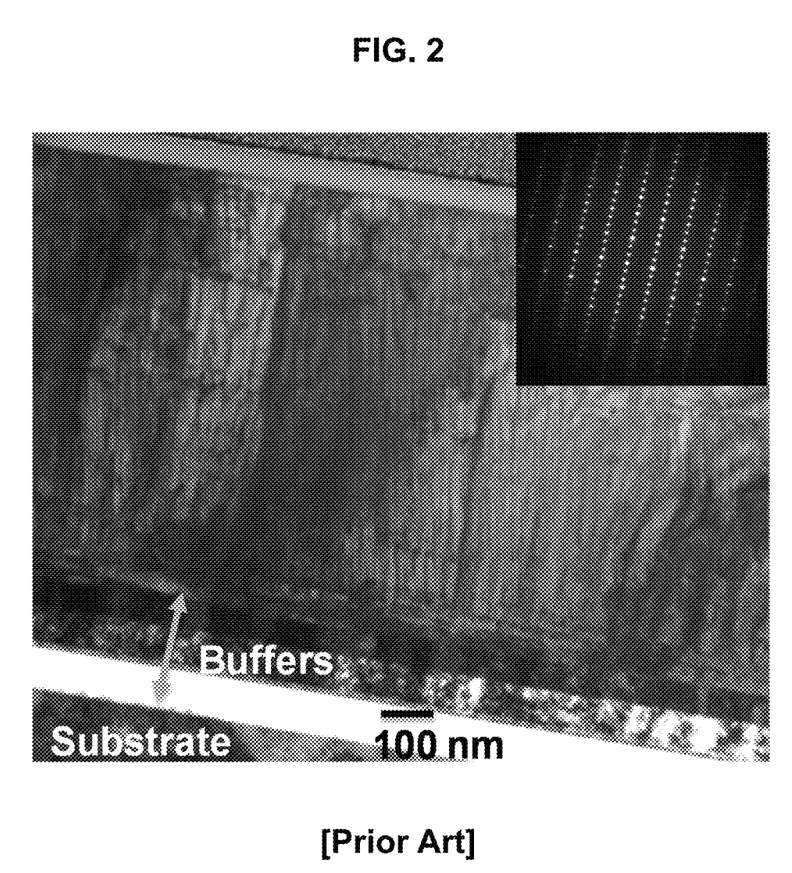
FIG. 2 illustrates a cross-sectional microstructure of Zr-doped superconducting film synthesized by MOCVD.

FIG. 2 displays a cross sectional microstructure of a (Gd,Y)Ba$_2$Cu$_3$O$_x$ (Gd—YBCO) film grown by MOCVD with BZO nanocolumns mostly oriented perpendicular to the film plane. As shown in FIG. 1, films doped with BZO exhibit two-fold improved performance in a magnetic field of 1 Tesla at 77 K, especially when exposed to fields oriented along the direction of the BZO nanocolumns (i.e., perpendicular to the tape). Also, since the nanocolumns exhibit a splay about the film growth direction, improved pinning is observed over a range of field orientations. Finally, BZO-doped films exhibit a significantly lower anisotropy (V. Selvamanickam et al., "Influence of Zr and Ce Doping on Electromagnetic Properties of (Gd,Y)—Ba—Cu—O Superconducting Tapes Fabricated by Metal Organic Chemical Vapor Deposition," Physica C 469, 2037 (2009)).

Most research focused on BZO-doped REBCO (RE=rare earth) tapes has reported critical currents in a magnetic field of 1-3 Tesla at 77 K. At least one research group has reported critical currents in high magnetic fields up to 30 T at 4.2 K (V. Braccini, et al., "Properties of recent IBAD-MOCVD Coated Conductors relevant to their high field, low temperature magnet use," Superconductor Science and Technology 24, 035001 (2011)). Unfortunately, there is little to no research reporting critical currents in practical magnetic fields of a few Tesla at intermediate temperatures of 20 to 50 K. Yet a number of 2G HTS applications such as wind generators, utility generators, marine motors, and industrial motors are being developed in these latter magnetic fields and intermediate temperature ranges (A. B. Abrahamsen, et al., "Feasibility study of 5 MW superconducting wind turbine generator," Physica C. 471, 1464-69 (2011); P. Kummeth, et al., "Development of synchronous machines with HTS rotor," Physica C. 426, 1358-64 (2005)).

It was recently demonstrated that the level of Zr needed to achieve a two-fold improvement in REBCO performance in a 1 T magnetic field at 77 K did not achieve the same improvement in the more practical magnetic field of a few Tesla at 20K to 50 K (hereafter "practical conditions") (V. Selvamanickam, et al., "Enhanced critical currents in high levels of Zr-added (Gd,Y)Ba$_2$Cu$_3$Ox superconducting tapes," Supercond. Sci. Technol. 26, 035006 (2013)). But it was also shown in the same publication that a higher level of Zr does in fact lead to an improvement in REBCO performance under the practical conditions (V. Selvamanickam, et al., "Enhanced critical currents in high levels of Zr-added (Gd,Y)Ba$_2$Cu$_3$O$_x$ superconducting tapes," Supercond. Sci. Technol. 26, 035006 (2013)). Particularly, the film's 'lift factor' (typically around 2.1 at 30 K, 3 T) is substantially improved with higher levels of Zr addition. 'Lift factor' refers to the ratio of the tape's critical current under the practical conditions to the critical current of the tape in a zero magnetic field at 77 K. It was also recently demonstrated that a high critical current density (a generally sought after superconductor performance goal) can be achieved in REBCO tapes with high levels of Zr addition at 77 K (V. Selvamanickam, et al., "Low-temperature, High Magnetic Field Critical Current Characteristics of Zr-added (Gd,Y)Ba$_2$Cu$_3$O$_x$ superconducting tapes," Supercond. Sci. Technol. 25, 125013 (2012)). These findings opened up the possibility that doping REBCO tapes with substantially high levels of Zr could produce both high critical current densities and high lift factors under the practical conditions. However, it has been found that the lift factors of REBCO tapes with high levels of added Zr are substantially inconsistent.

Thus, there is need in the art for methods and compositions that can achieve in a superconductor both a high lift factor and high critical current density under practical operating conditions.

SUMMARY

A summary of certain embodiments disclosed herein is set forth below. It's understood that this section is presented merely to provide the reader with a brief summary of certain embodiments and that these descriptions are not intended to limit this application's scope. Indeed, this disclosure may encompass a variety of embodiments that may not be set forth herein.

A superconducting tape can be fabricated to achieve a high lift factor in an approximately 3 T magnetic field applied perpendicular to the tape at approximately 30 K. In one embodiment, a superconducting tape can be fabricated to achieve a lift factor greater than 3.0 or greater than 4.0 in an approximately 3 T magnetic field applied perpendicular to a REBCO tape at approximately 30 K.

In another embodiment, a superconducting tape is fabricated to include a critical current density less than or equal to approximately 4.2 MA/cm$^2$ at 77 K in the absence of an external magnetic field. In yet another embodiment, the superconducting tape is fabricated to include a critical current density greater than or equal to approximately 12 MA/cm$^2$ at approximately 30 K in a magnetic field of approximately 3 T having an orientation parallel to the c-axis.

BRIEF DESCRIPTION OF THE DRAWINGS

The foregoing summary, as well as the following detailed description, will be better understood when read in conjunction with the appended drawings. For the purpose of illustration only, there is shown in the drawings certain embodiments. It's understood, however, that the inventive concepts disclosed herein are not limited to the precise arrangements and instrumentalities shown in the figures.

DETAILED DESCRIPTION

Before explaining at least one embodiment in detail, it should be understood that the inventive concepts set forth herein are not limited in their application to the construction details or component arrangements set forth in the following description or illustrated in the drawings. It should also be understood that the phraseology and terminology employed herein are merely for descriptive purposes and should not be considered limiting.

It should further be understood that any one of the described features may be used separately or in combination with other features. Other invented systems, methods, features, and advantages will be or become apparent to one with skill in the art upon examining the drawings and the detailed description herein. It's intended that all such additional systems, methods, features, and advantages be protected by the accompanying claims.

It is one objective of the embodiments described herein to fabricate a superconducting tape that can consistently achieve a lift factor of at least approximately 3.0 in an approximately 3 T magnetic field applied perpendicular to a REBCO tape at approximately 30 K. It is another objective of the embodiments described herein to fabricate a superconducting tape that can consistently achieve a lift factor of at least approximately 4.0 in an approximately 3 T magnetic field applied perpendicular to a REBCO tape at approximately 30 K. In one embodiment, the REBCO tape is fabricated by MOCVD.

In an embodiment, the REBCO tape may include a substrate, a buffer layer overlying the substrate, a superconducting film followed by a capping layer (typically a noble metal), and a stabilizer layer (typically a non-noble metal such as copper). The buffer layer may consist of several distinct films.

In one embodiment, the substrate may include a metal alloy that can withstand high temperatures, such as nickel-based or iron-based alloys. Examples may include Hastelloy®, Inconel® group of alloys, stainless steel alloys, or nickel-tungsten and nickel-chromium alloys. The substrate may typically be in the form of a thin tape, approximately 25 to 100 μm thick, approximately 2 mm to 100 mm wide, and approximately 1 to 10,000 meters long. The substrate can be treated by techniques such as polishing to produce a smooth surface with an approximately 0.5 to 20 nm surface roughness. Additionally, in another embodiment, the substrate may be treated to be biaxially textured, such as by the known RABiTS (rolling assisted biaxially textured substrate) technique. Alternatively, in yet another embodiment, the substrate may be a non-textured polycrystalline, such as commercially available Hastelloy®, Inconel® group of alloys, and stainless steel alloys.

In another embodiment, the buffer layer may be a single layer, or more commonly, be made up of several films. In yet another embodiment, the buffer layer may include a biaxially textured film, having a crystalline texture that is generally aligned along crystal axes both in-plane and out-of-plane of the film. Such biaxial texturing may be accomplished by ion beam assisted deposition (IBAD). For example, IBAD can be used to form a biaxially-textured buffer layer to produce a superconducting layer having desirable crystallographic orientation for superior superconducting properties.

In an embodiment, magnesium oxide can be used as a film for the IBAD film, and may be on the order of approximately 1 to approximately 500 nm, such as approximately 5 to approximately 50 nanometers. The buffer layer may also include additional films, such as a barrier film provided to directly contact and be placed in between an IBAD film and the substrate. In this embodiment, the barrier film may be an oxide, such as alumina or zirconates (e.g., yttria stabilized zirconia, gadolinium zirconate, etc.), and can function to isolate the substrate from the IBAD film. Typical thicknesses of the barrier film may be within a range of approximately 1 to approximately 200 nm.

Still further, in yet another embodiment, the buffer layer may also include an epitaxially grown film(s) such as $LaMnO_3$, $SrTiO_3$, $CeO_2$, formed over the IBAD film. An epitaxially grown film can help to accommodate the lattice mismatch between MgO and REBCO. In other embodiments, all buffer films may be deposited by various physical vapor deposition, solution coating, or chemical vapor deposition techniques.

In an embodiment, the superconducting REBCO film may consist of a single rare-earth element such as yttrium, gadolinium, neodymium, erbium, europium, samarium, dysprosium, holmium. In another embodiment, the superconducting REBCO film may consist of one or more of these rare-earth elements, in any combination. The superconducting film may be approximately 0.5 to 10 μm thick. In still another embodiment, the REBCO film can be deposited via a thin film physical vapor deposition technique (e.g., pulsed laser deposition (PLD)), evaporation or sputtering, chemical vapor deposition (CVD), or chemical solution deposition (CSD).

In addition to the constituent RE, Ba, Cu cations, in another embodiment, dopant materials can be added to the starting source material incorporated in the superconducting film to improve flux pinning. In one embodiment, if the superconducting film is made by PLD or sputtering, one or more dopants such as $BaZrO_3$, $BaSnO_3$, $BaHfO_3$, $BaTiO_3$, $BaCeO_3$, $REBa_2NbO_6$, $REBa_2TaO_6$, $CeO_2$, $ZrO_2$, or YSZ can be mixed with the precursors to form a target for ablation. Alternatively, in another embodiment, the dopants may be made as a segment of a target or may be made into a separate target.

In an embodiment, as an ablation laser, such as an excimer laser, scans over the target(s), the REBCO and dopant material can be deposited together to form a film on the buffered substrate. Alternatively, in another embodiment, if the superconducting film is made by evaporation, the dopant material may be added in the source as a separate element, such as Zr, Ce, Ti, Nb, Hf, Ta, and Sn.

In one embodiment, the superconducting film may be made by a chemical deposition process, such as metal organic chemical vapor deposition (MOCVD), metal organic deposition (MOD), or chemical solution deposition (CSD). In these embodiments, the dopants, such as Zr, Ce, Ti, Nb, Hf, Ta, and Sn, can be added as metal organics in the starting precursor. For example, the dopant can be added in the form of tetramethyl heptanedionate (thd) in the case of MOCVD, or as acetates or acetyl acetonates in the case of MOD or CSD. A solution of all precursors can be made using a solvent such as tetrahydofuran (THF) in the case of MOCVD, and trifluoroacetic acid (TFA) in the case of MOD or CSD.

In an embodiment, in the MOCVD process, the REBCO precursor solution and dopant precursor solution may be mixed together and delivered in a vaporizer as a single solution. Alternatively, the REBCO precursor solution and dopant precursor solution can be delivered in a vaporizer as separate solutions. In another embodiment, the vaporized precursors containing the RE, Ba, Cu and dopant are delivered by means of a carrier gas, such as argon. The precursors can then be mixed with oxygen gas and together injected into an MOCVD reactor through a showerhead. In yet another embodiment, the precursor vapor can be deposited on the buffered substrate that is heated by means of a resistive or radiative heater. The result is a REBCO film with an embedded oxide of the dopant compound. In still another embodiment, using Zr dopant causes BZO to form in the REBCO film. It has been found that BZO and other dopant materials form as nanocolumns or other nanostructures in the REBCO film, thereby enabling improved flux pinning (V. Selvamanickam, et al., "Influence of Zr and Ce Doping on Electromagnetic Properties of (Gd,Y)—Ba—Cu—O Superconducting Tapes Fabricated by Metal Organic Chemical Vapor Deposition," Physica C 469, 2037 (2009); V. Selvamanickam, et al., "Enhanced critical currents in high levels of Zr-added $(Gd,Y)Ba_2Cu_3O_x$ superconducting tapes," Supercond. Sci. Technol. 26, 035006 (2013); V. Selvamanickam, et al., "Low-temperature, High Magnetic Field Critical Current Characteristics of Zr-added (Gd,Y) $Ba_2Cu_3O_x$ superconducting tapes," Supercond. Sci. Technol. 25, 125013 (2012)).

In another embodiment, the REBCO tape may also include a capping layer and a stabilizer layer, which can be implemented to provide a low resistance interface and electrical stabilization to help prevent superconductor burn-out during practical use. In yet another embodiment, a noble metal can be used as the capping layer to prevent unwanted interactions between the stabilizer layer(s) and the superconducting layer. Some noble metals may include gold, silver, platinum, and palladium. In an embodiment, the capping layer may be approximately 0.01 µm to approximately 20 µm thick, or approximately 1 µm thick to approximately 3 µm thick. The capping layer can be deposited by sputtering, evaporation, or electrodeposition.

In one embodiment, the stabilizer layer may function as a protection/shunt layer to enhance stability against harsh environmental conditions and superconductivity quench. The layer may be dense and thermally and electrically conductive, and can function to bypass electrical current in case of failure of the superconducting layer or if the critical current of the superconducting layer is exceeded. It may also be formed by any one of various thick and thin film forming techniques, such as by laminating a pre-formed copper strip onto the superconducting tape, or by using an intermediary bonding material such as a solder.

In one embodiment, the composition of the superconducting film (without the capping and stabilizer layers) can be measured via ICP spectroscopy. In another embodiment, the critical current density of the superconducting tape can be measured by a four probe technique at 77 K, in a zero applied magnetic field, and in the presence of various magnetic fields at temperatures between approximately 4.2 K and 77 K. In another embodiment, the in-field critical current measurement may be performed with the orientation of magnetic field parallel as well as perpendicular to the tape normal. Additionally, in yet another embodiment, the critical current density may be measured at intermediate magnetic field orientations. The lift factor at any temperature and magnetic field can be calculated as the ratio of the critical current of the tape at that condition to the critical current at 77 K in a zero applied magnetic field.

Figure 3:
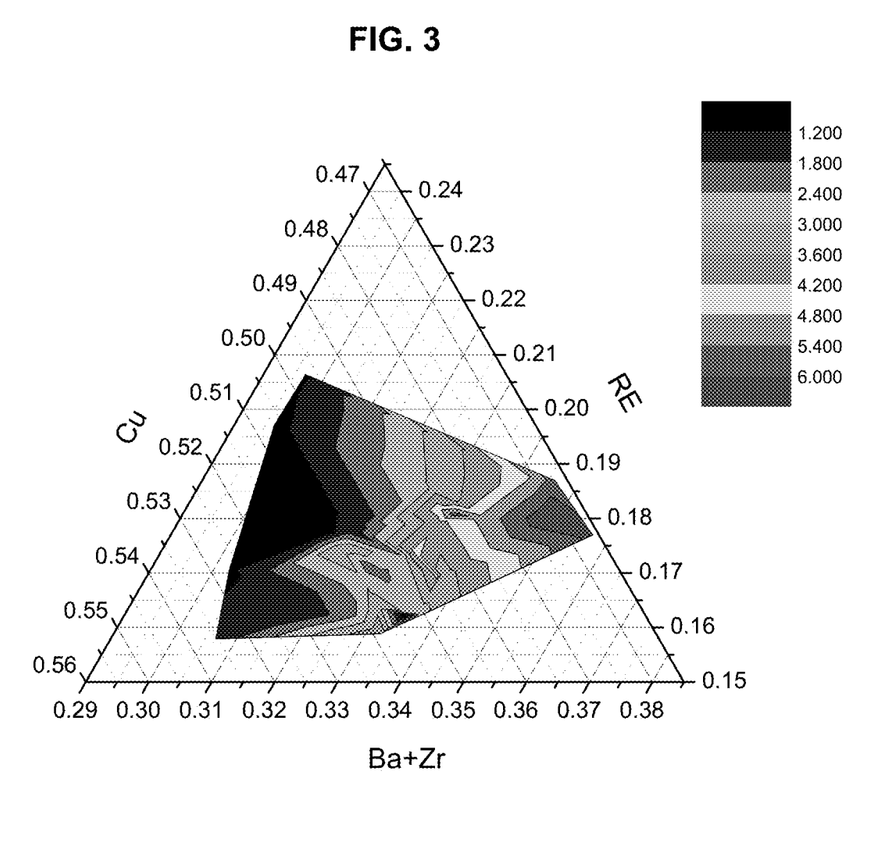
FIG. 3 illustrates lift factors in a magnetic field of 3 T at 30 K of 15-25 mol. % Zr-added GdYBCO tapes of various compositions as measured by ICP spectroscopy of the films, in accordance with an embodiment.

Referring to FIG. 3, by way of example only, in one embodiment the lift factors of various superconductor film compositions in an approximately 3 T magnetic field at approximately 30 K can be mapped over a composition range of approximately 15.0% to approximately 24.5% of RE (Gd+Y), approximately 29.0% to approximately 38.5% Ba+Zr, and approximately 46.5% to approximately 56.0% Cu. These films can be fabricated by a MOCVD process using tetramethyl heptanedionate precursors of Gd, Y, Ba, and Cu, mixed in a THF solvent. The precursor recipe can include an additional 15 to 25 mol. % Zr. If all the cations (RE, Ba, Cu, Zr) in the precursor are incorporated in the film, 15% Zr may correspond to a Zr content equal to 2.4 atomic % of all cations in the film. The solution can be flash vaporized at about 270° C. and the precursors deposited on a $LaMnO_3$-buffered IBAD MgO-based Hastelloy substrate. The deposition can be conducted at a temperature of 750 to 850° C. at a pressure of 2 to 3 Torr.

As illustrated in FIG. 3, in an embodiment, superconducting tapes having a barium+zirconium content greater than approximately 32.0 atomic % and a copper content less than approximately 49.0 atomic %, can exhibit a lift factor greater than approximately 3.0 in an approximately 3 T magnetic field at approximately 30 K. In one embodiment, for samples exhibiting a lift factor above approximately 3.0 at approximately 3 T at approximately 30 K, the Zr content in the film may be at least 1.65 atomic %, and the barium content may be at least 29.9%. In another embodiment, superconducting tapes having a barium+zirconium content greater than approximately 33.0 atomic %, a copper content less than approximately 49.0% atomic %, can exhibit a lift factor greater than approximately 4.0 in an approximately 3 T magnetic field at approximately 30 K. In one embodiment, for samples exhibiting a lift factor above approximately 4.0 at approximately 3 T at approximately 30 K, the Zr content in the film may be at least 1.65 atomic %, and the barium content may be at least 30.5 atomic %.

Figure 4:
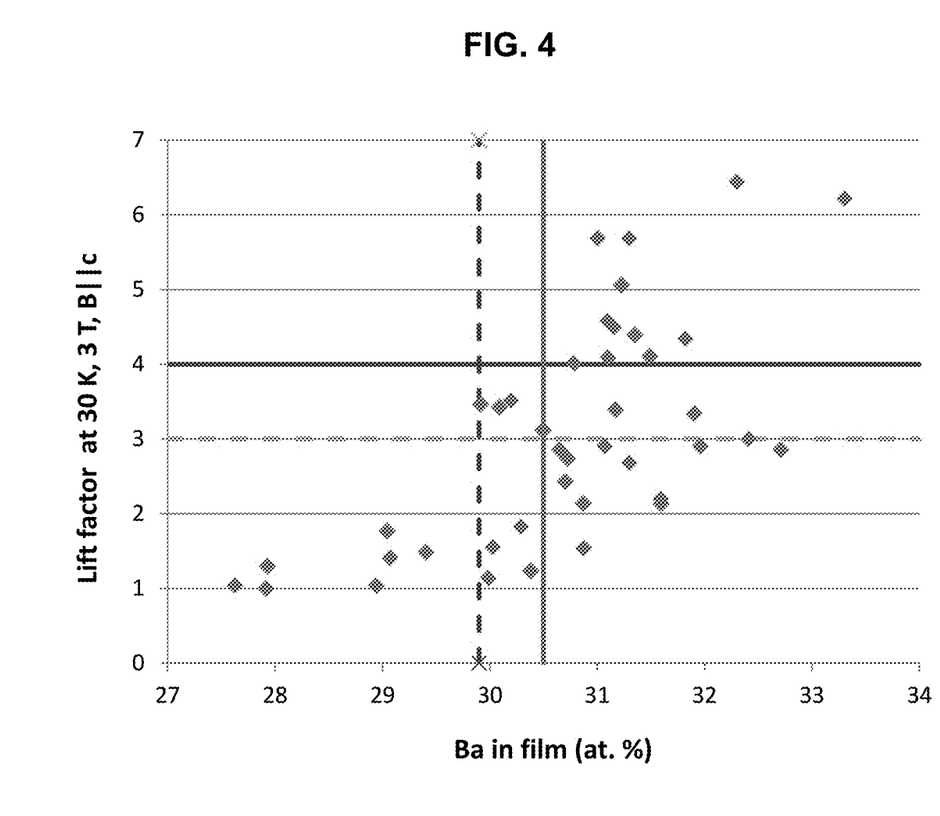
FIG. 4 illustrates lift factors in a magnetic field of 3 T at 30 K of 15-25 mol. % Zr-added GdYBCO tapes as a function of barium expressed as an atomic percent of all cations (Gd, Y, Ba, Cu, Zr) in the film, in accordance with an embodiment.
Figure 5:
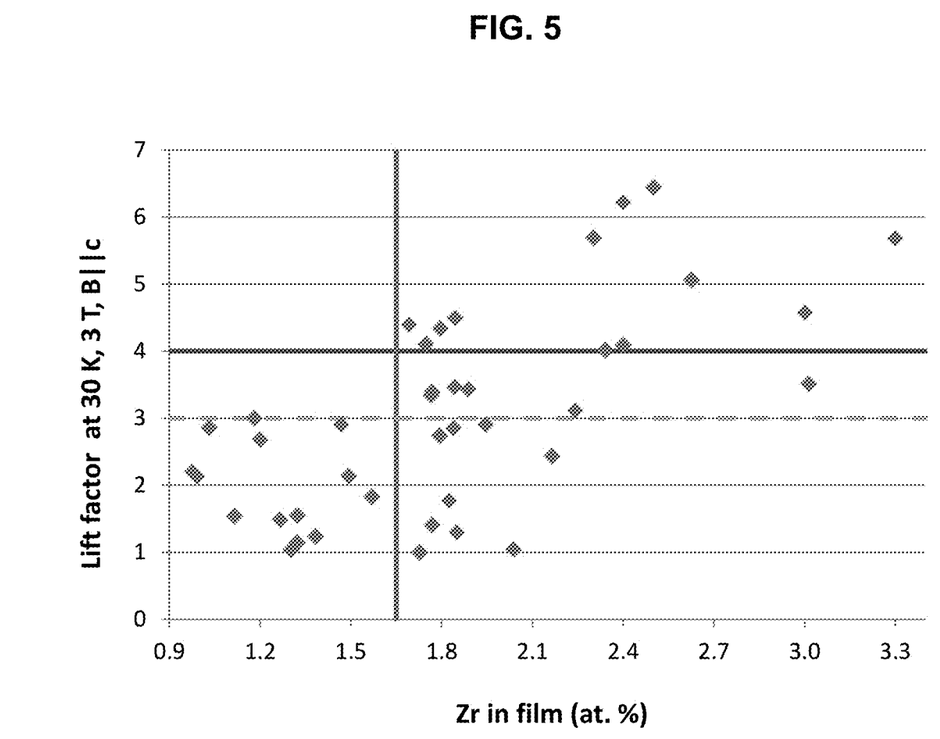
FIG. 5 illustrates lift factors in a magnetic field of 3 T at 30 K of 15-25 mol. % Zr-added GdYBCO tapes as a function of zirconium expressed as an atomic percent of all cations (Gd, Y, Ba, Cu, Zr) in the film, in accordance with an embodiment.
Figure 6:
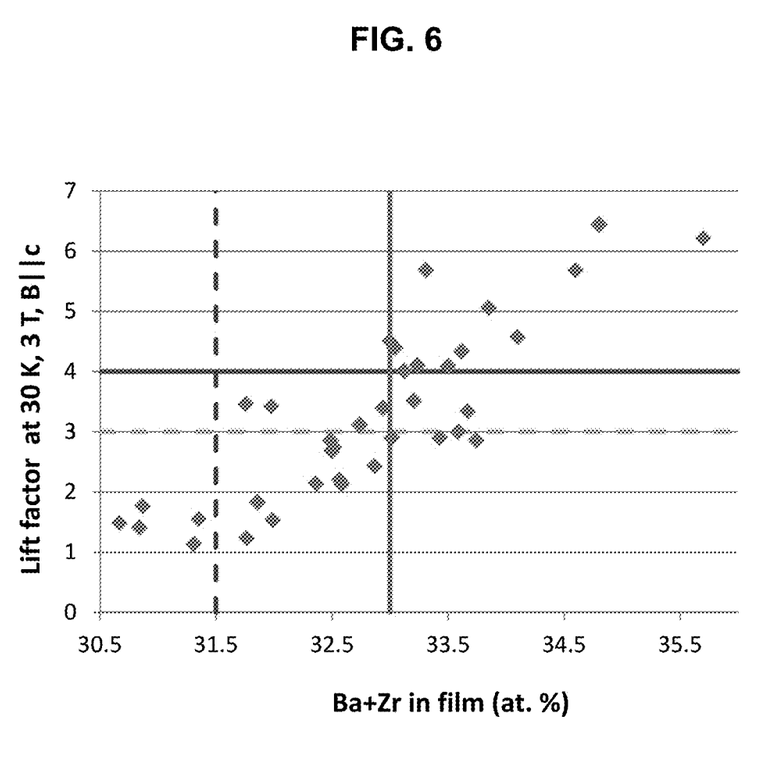
FIG. 6 illustrates lift factors in a magnetic field of 3 T at 30 K of 15-25 mol. % Zr-added GdYBCO tapes as a function of barium+zirconium expressed as an atomic percent of all cations (Gd, Y, Ba, Cu, Zr) in the film, in accordance with an embodiment.
Figure 7:
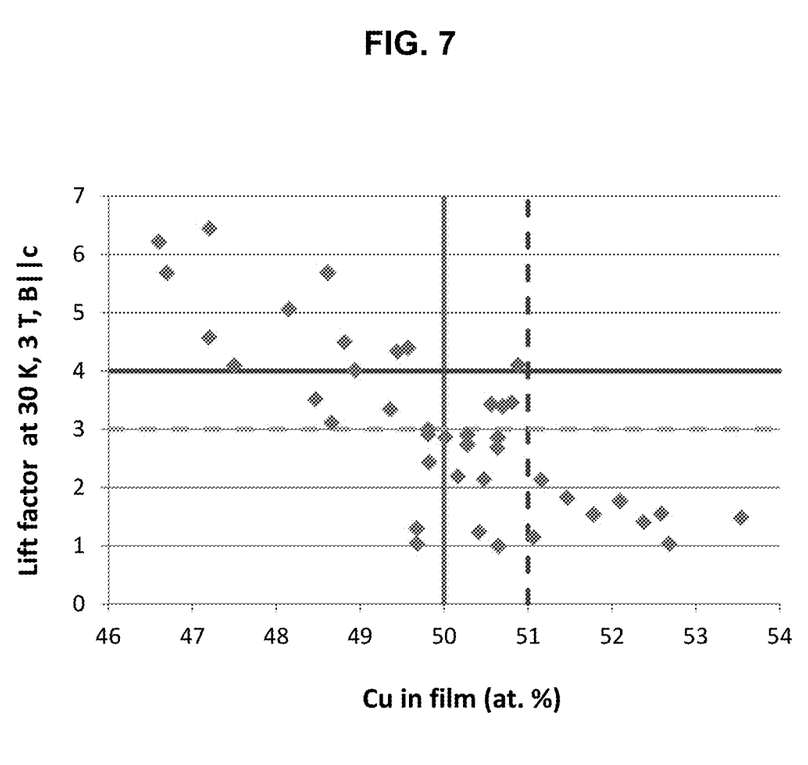
FIG. 7 illustrates lift factors in a magnetic field of 3 T at 30 K of 15-25 mol. % Zr-added GdYBCO tapes as a function of copper expressed as an atomic percent of all cations (Gd, Y, Ba, Cu, Zr) in the film, in accordance with an embodiment.

The limiting values of barium, zirconium, barium+zirconium, and copper in the film to achieve a lift factor greater than approximately 3.0 and approximately 4.0 in an approximately 3 T field at approximately 30 K are illustrated, by way of example only, in FIGS. 4, 5, 6 and 7, respectively. For example, FIG. 4 illustrates the limiting value of barium necessary to achieve a lift factor greater than approximately 3.0 in an approximately 3 T field at approximately 30 K. In one embodiment, Ba content greater than approximately 29.9 at. % can achieve a lift factor above 3. In another embodiment, Ba content greater than approximately 30.5 at. % can achieve a lift factor above 4. FIG. 5, by way of example only, illustrates the limiting value of zirconium necessary to achieve a lift factor greater than approximately 3.0 and approximately 4.0 in an approximately 3 T field at approximately 30 K. In one embodiment, Zr content greater than approximately 1.65 at. % can achieve a lift factor above both 3 and 4. FIG. 6, by way of example only, illustrates the limiting value of barium+zirconium necessary to achieve a lift factor greater than approximately 3.0 and approximately 4.0 in an approximately 3 T field at approximately 30 K. In one embodiment, Ba+Zr content greater than approximately 31.5 at. % can achieve a lift factor above 3. In another embodiment, Ba+Zr content greater than approximately 33.0 at. % can achieve a lift factor above 4. FIG. 7, by way of example only, illustrates the limiting value of copper necessary to achieve a lift factor greater than approximately 3.0 and approximately 4.0 in an approximately 3 T field at approximately 30 K. In one embodiment, Cu content less than approximately 51.0% at. % can achieve a lift factor above 3. In another embodiment, Cu content less than approximately 50.0 at. % can achieve a lift factor above 4.

Figure 8:
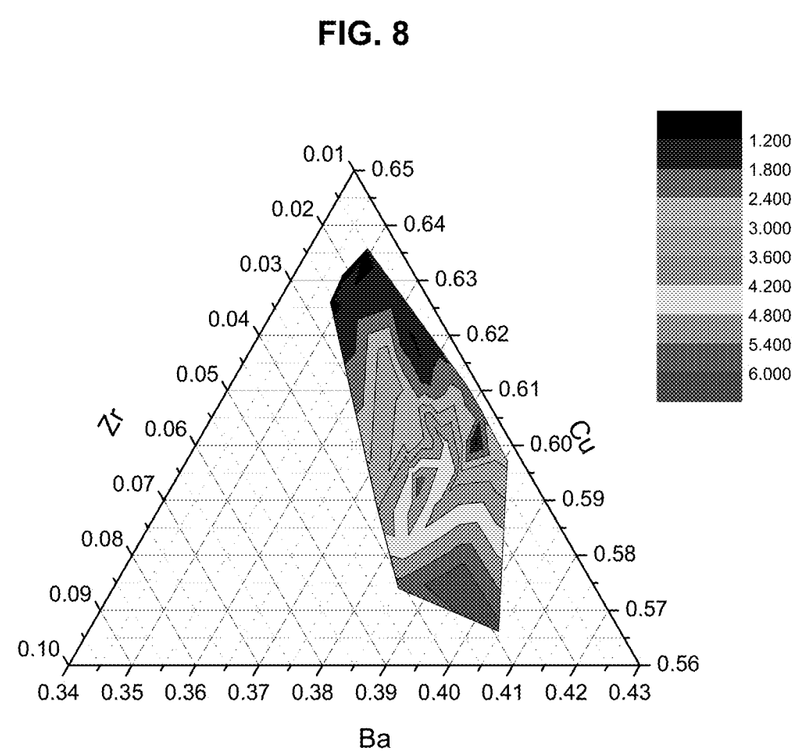
FIG. 8 illustrates lift factors in a magnetic field of 3 T at 30 K of 15-25 mol. % Zr-added GdYBCO tapes of various compositions as measured by ICP spectroscopy of the films, in accordance with an embodiment.

Referring to FIG. 8, by way of example only, in one embodiment the lift factors in an approximately 3 T magnetic field at approximately 30 K of various superconductor film compositions normalized to the Ba+Zr+Cu values can be mapped over a composition range of approximately 1.0% to approximately 10.0% of Zr, approximately 34.0% to approximately 43.0% Ba, and approximately 56.0% to approximately 65.0% Cu.

As illustrated in FIG. 8, in an embodiment, superconducting tapes having a barium content greater than approximately 37.5% of the total content of Ba+Cu+Zr, a copper content less than approximately 60.5% of the total content of Ba+Cu+Zr, and a zirconium content less than approximately 2% of the total content of Ba+Cu+Zr can exhibit a lift factor greater than approximately 3.0 in an approximately 3 T magnetic field at approximately 30 K. In another embodiment, superconducting tapes having a barium content greater than approximately 38% of the total content of Ba+Cu+Zr, a copper content less than approximately 59.5% of the total content of Ba+Cu+Zr, and a Zr content less than approximately 2.5% of the total content of Ba+Cu+Zr can exhibit a lift factor greater than approximately 4.0 in an approximately 3 T magnetic field at approximately 30 K.

Figure 9:
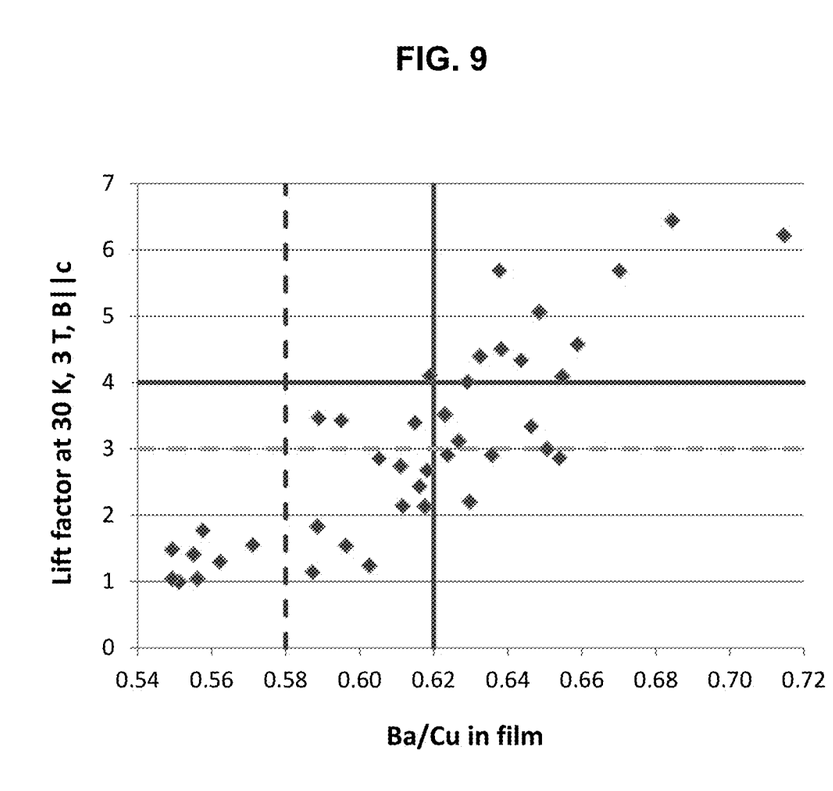
FIG. 9 illustrates lift factors in a magnetic field of 3 T at 30 K of 15-25 mol. % Zr-added GdYBCO tapes as a function of barium to copper ratio in the film, in accordance with an embodiment.
Figure 10:
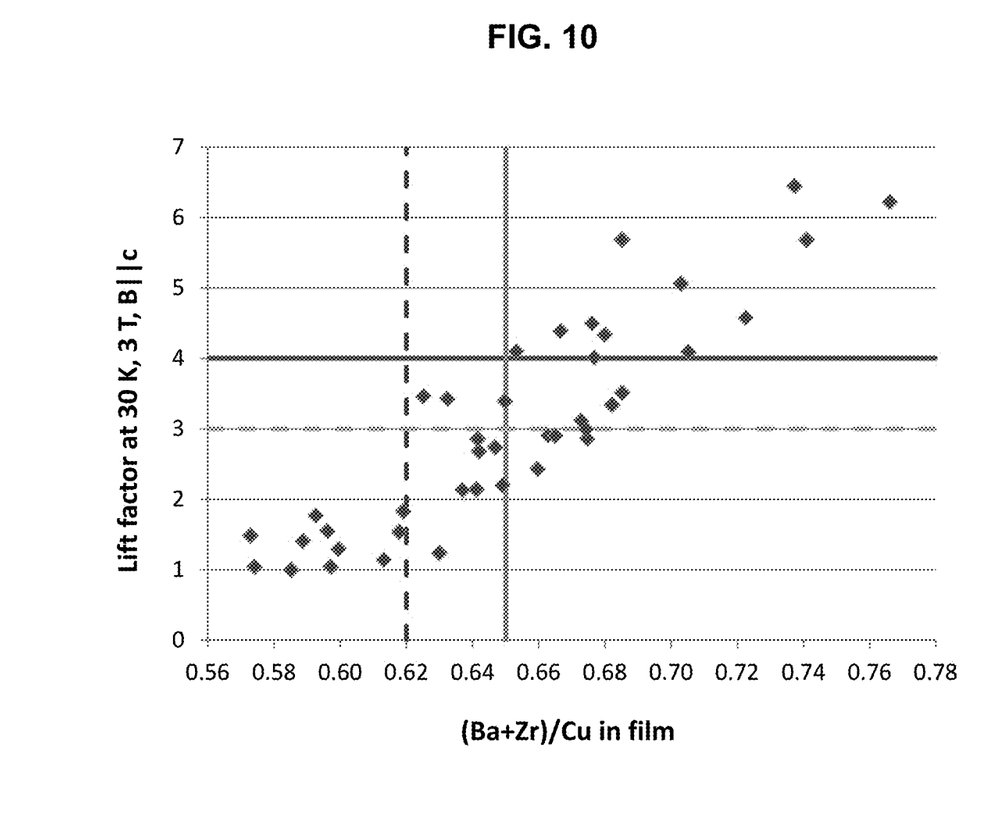
FIG. 10 illustrates lift factors in a magnetic field of 3 T at 30 K of 15-25 mol. % Zr-added GdYBCO tapes as a function of barium+zirconium to copper ratio in the film, in accordance with an embodiment.

The ratios of barium to copper and barium+zirconium to copper in the film to achieve a lift factor greater than approximately 3 and approximately 4 in an approximately 3 T field at approximately 30 K are illustrated, by way of example only, in FIGS. 9 and 10, respectively. For example, FIG. 9 illustrates the ratio of barium to copper necessary to achieve a lift factor greater than approximately 3.0 in an approximately 3 T field at approximately 30 K. In one embodiment, a Ba to Cu ratio greater than or equal to at least approximately 0.58 can achieve a lift factor above 3. In another embodiment, a Ba to Cu ratio greater than or equal to at least approximately 0.62 can achieve a lift factor above 4. FIG. 10, by way of example only, illustrates the ratio of barium+zirconium to copper necessary to achieve a lift factor greater than approximately 3 and approximately 4 in an approximately 3 T field at approximately 30 K. In one embodiment, a Ba+Zr to Cu ratio greater than or equal to at least approximately 0.62 can achieve a lift factor above 3. In another embodiment, a Ba+Zr to Cu content greater than or equal to at least approximately 0.65 can achieve a lift factor above 4.

Figure 11:
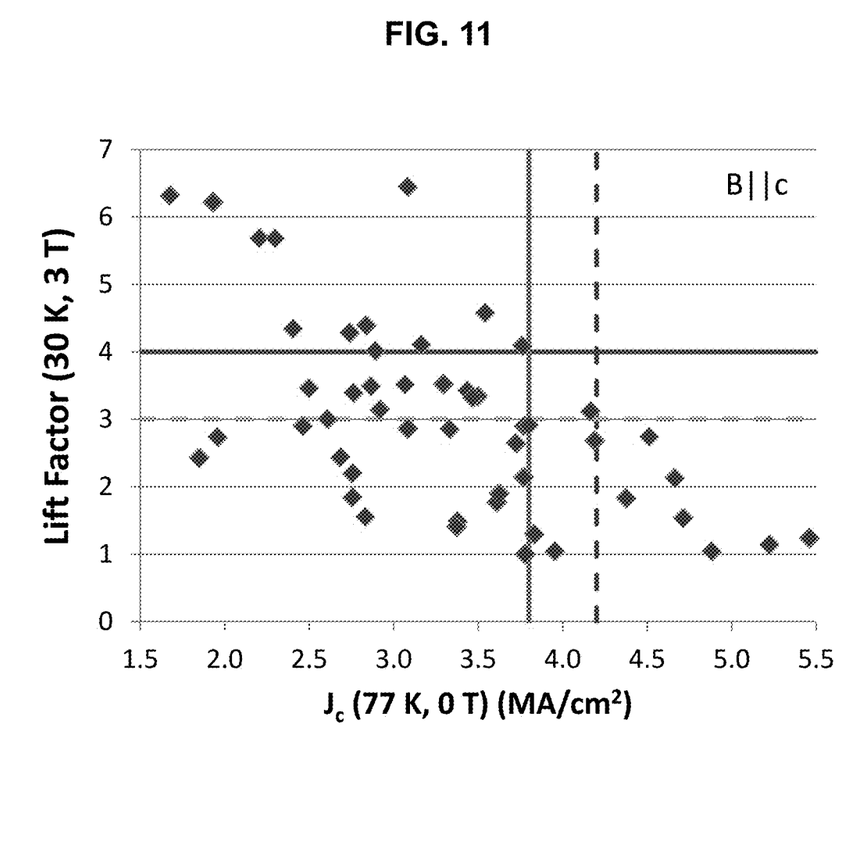
FIG. 11 illustrates lift factors in a magnetic field of 3 Tesla at 30 K of 15-20 mol. % Zr-added GdYBCO tapes as a function of critical current density at 77 K in zero magnetic field.

FIG. 11 illustrates the lift factors of several (Gd, Y)—Ba—Cu—O tapes with approximately 15 to 25 mol. % Zr addition in a magnetic field of approximately 3 T at approximately 30 K (applied perpendicular to the tape) having a range of critical current densities ($J_c$) (e.g., 2 to 5 $MA/cm^2$) in a magnetic field of 0 T at 77 K. Unexpectedly, only those superconducting tapes having a critical current density less than 4.2 $MA/cm^2$ in a 0 T magnetic field at 77 K may exhibit a lift factor greater than approximately 3.0 in an approximately 3 T magnetic field at approximately 30 K. Furthermore, only those superconducting tapes having a critical current density less than 3.8 $MA/cm^2$ in a 0 T magnetic field at 77 K may exhibit a lift factor greater than approximately 4.0 in an approximately 3 T magnetic field at approximately 30 K. The trend in superconductor research has been to increase the critical current density at 77 K in zero magnetic field. Therefore, the finding that a higher critical current density at 77 K in a zero magnetic field may be undesirable from the point of view of achieving a high lift factor in practical conditions is unexpected and has not previously been foreseen in the art.

It is another objective of the application to achieve in a superconductor tape both a lift factor greater than approximately 3.0 and a high absolute critical current density value in an approximately 3 T magnetic field at approximately 30 K. In one embodiment, the critical current density of the tape in an approximately 0 T magnetic field at approximately 77 K can be high enough to achieve a critical current density over approximately 800 A/cm-width in an approximately 3 T magnetic field at approximately 30 K. For example, an approximately 0.91 μm thick superconducting film with cation composition of approximately 30.17% Ba, approximately 50.7% Cu, approximately 8.86% Y, approximately 7.5% Gd, and approximately 1.77% Zr, may exhibit a critical current density of approximately 2.76 $MA/cm^2$ at 77 K, 0 T and a lift factor of approximately 3.4 at approximately 30 K and approximately 3 T. Accordingly, the critical current of the tape may be approximately 851 A/cm at approximately 30 K and approximately 3 T. In still a further embodiment, superconducting tapes having a barium+zirconium content greater than approximately 31.5 atomic %, a copper content less than approximately 51 atomic %, and a rare earth (e.g. yttrium+gadolinium) content less than approximately 19.5 atomic % can exhibit a critical current density over approximately 800 A/cm-width in an approximately 3 T magnetic field at approximately 30 K.

In another embodiment, the above identified correlation between critical current density and lift factor may be observed at temperatures below approximately 60 K. For example, an approximately 0.85 μm thick superconducting film may exhibit a critical current density of approximately 3.16 $MA/cm^2$ at 77 K, 0 T and at 3 T, lift factors of approximately 1.25 at 59 K, 1.57 at 54 K, 1.90 at 49 K, 2.99 at 38 K, 4.1 at 30 K, 4.64 at 25 K, and 5.67 at 20 K. In yet another embodiment, a superconducting film with a film thickness of approximately 0.91 μm may exhibit a critical current density of approximately 4.66 $MA/cm^2$ at 77 K, 0 T and at 3 T, lift factors of approximately 0.61 at 59 K, 0.77 at 54 K, 0.92 at 49 K, 1.29 at 39 K, 1.68 at 30 K, 1.90 at 25 K, and 2.21 at 20 K.

In yet another embodiment, a similar correlation may exist between the superconducting tape composition and lift factor at temperatures below approximately 60 K. For example, a 0.85 μm thick superconducting film with cation composition of approximately 31.49% Ba, approximately 50.88% Cu, approximately 8.56% Y, approximately 7.3% Gd, and approximately 1.75% Zr, may exhibit a critical current density of approximately 3.16 $MA/cm^2$ at 77 K, 0 T and at 3 T, lift factors at approximately 1.25 at 59 K, 1.57 at 54 K, 1.90 at 49 K, 2.99 at 38 K, 4.1 at 30 K, 4.64 at 25 K, and 5.67 at 20 K.

The Ba+Zr—Cu ratio can have the strongest impact on lift factor. Thus, in other embodiments, the superconducting REBCO tape may include one of the following RE elements: Y, Gd, Dy, Ho, Er, Tb, Yb, Eu, Nd, or Sm. For each type of superconducting tape, there may be a similar correlation between critical current density and lift factor, as observed in FIGS. 3 and 11. For example, an approximately 0.91 μm thick superconducting film of (Gd,Dy)—Ba—Cu—O composition with Zr doping may exhibit a critical current density of approximately 2.61 MA/cm$^2$ at 77 K, 0 T and a lift factor of approximately 3.0 at approximately 30 K and approximately 3 T.

It is yet another objective of the application to achieve in a superconductor tape both a lift factor greater than approximately 4.0 and a high absolute critical current density value in an approximately 3 T magnetic field at approximately 30 K. In one embodiment, the critical current density of the tape in an approximately 0 T magnetic field at approximately 77 K can be high enough to achieve a critical current over approximately 2160 A/12 mm-width in an approximately 3 T magnetic field at approximately 30 K. For example, the below table 1 illustrates the critical current densities and lift factors of various 0.9 μm thick superconducting films having different approximated cation compositions.

TABLE 1

Lift Factors of REBCO Superconducting Films

| Tape # | Cu % | Y % | Zr % | Ba % | Gd % | Jc (77 K, 0 T) | Lift factor (30 K, 3 T) | Jc (30 K, 3 T) |
|---|---|---|---|---|---|---|---|---|
| 1 | 49.6 | 9.4 | 1.7 | 31.3 | 8.0 | 2.84 | 4.39 | 12.47 |
| 2 | 47.2 | 9.7 | 3   | 31.1 | 9.1 | 3.54 | 4.58 | 16.21 |
| 3 | 47.5 | 9.8 | 2.4 | 31.1 | 9.2 | 3.76 | 4.09 | 15.38 |
| 4 | 46.6 | 9.1 | 2.4 | 33.3 | 8.6 | 1.93 | 6.22 | 12.01 |
| 5 | 46.7 | 9.6 | 3.3 | 31.3 | 9.1 | 2.30 | 5.69 | 13.09 |
| 6 | 47.2 | 9.2 | 2.5 | 32.3 | 8.8 | 3.10 | 6.45 | 20.0 |

Accordingly, the critical current of tape 1 may be approximately 1346 A/12 mm at approximately 30 K and approximately 3 T. The critical current of tape 2 may be approximately 1751 A/12 mm at approximately 30 K and approximately 3 T. The critical current of tape 3 may be approximately 1661 A/12 mm at approximately 30 K and approximately 3 T. The critical current of tape 4 may be approximately 1297 A/12 mm at approximately 30 K and approximately 3 T. The critical current of tape 5 may be approximately 1413 A/12 mm at approximately 30 K and approximately 3 T. And the critical current of tape 6 may be approximately 2160 A/12 mm at approximately 30 K and approximately 3 T.

Other dopants can work equally as well as Zr. Thus, in still other embodiments, the superconducting tapes are doped with one or more of the following constituents: niobium, tantalum, hafnium, tin, cerium and titanium. For each type of superconducting tape, there may be a similar correlation between critical current density and lift factor, as observed in FIGS. 3 and 11.

It's understood that the above description is intended to be illustrative, and not restrictive. The material has been presented to enable any person skilled in the art to make and use the inventive concepts described herein, and is provided in the context of particular embodiments, variations of which will be readily apparent to those skilled in the art (e.g., some of the disclosed embodiments may be used in combination with each other). Many other embodiments will be apparent to those of skill in the art upon reviewing the above description. The scope of the invention therefore should be determined with reference to the appended claims, along with the full scope of equivalents to which such claims are entitled. In the appended claims, the terms "including" and "in which" are used as the plain-English equivalents of the respective terms "comprising" and "wherein."

Examples

A Hastelloy C-276 tape with alumina and yttria buffer layers was coated with MgO by ion beam assisted deposition (IBAD) at room temperature to yield biaxially-textured film. Homo-epitaxial MgO and LaMnO$_3$ were deposited on the IBAD MgO layer by magnetron sputtering in a temperature range of 600 to 800° C. The buffered tape was used for MOCVD of GdYBCO film with Zr addition. Tetramethyl heptanedionate precursors with a cation composition of $Zr_{0.15}Gd_{0.6}Y_{0.6}Ba_2Cu_{2.3}$ were dissolved in a solvent of tetrahydrofuran at a molarity of 0.05 M/L. The precursor solution was delivered at a flow rate of 2.5 mL/min, flash vaporized at 270° C. and carried in a gas of argon, mixed with oxygen and then injected into the reactor using a linear showerhead. The precursor vapor was deposited at temperature range of approximately 830° C. at a reactor pressure of 2.3 Torr on the buffered IBAD tape moving at a speed of 2.1 cm/min. The thickness of the superconductor film was measured by cross-sectional transmission electron microscopy to be 0.925 μm. The cation atomic composition of the film was determined by ICP spectroscopic analysis to be 31.35% Ba, 49.57% Cu, 8.03% Gd, 9.36% Y and 1.69% Zr. The critical current density of the tape was measured to be 2.84 MA/cm$^2$ at 77 K, 0 T. At 30 K and a 3 T field applied perpendicular to the tape, a lift factor of 4.4 was achieved corresponding to a critical current of 1153 A/cm.

Tetramethyl heptanedionate precursors with a cation composition of $Zr_{0.15}Gd_{0.6}Y_{0.6}Ba_2Cu_{2.2}$ were dissolved in a solvent of tetrahydrofuran at a molarity of 0.05 M/L. The precursor solution was delivered at a flow rate of 2.5 mL/min, flash vaporized at 270° C. and carried in a gas of argon, then mixed with oxygen and injected into the reactor using a linear showerhead. The precursor vapor was deposited at temperature range of approximately 800° C. at a reactor pressure of 2.3 Torr on the buffered IBAD tape moving at a speed of 2.1 cm/min. The thickness of the superconductor film was measured by cross-sectional transmission electron microscopy to be 0.91 μm. The cation atomic composition of the film was determined by ICP spectroscopic analysis to be 30.29% Ba, 51.47% Cu, 8.12% Gd, 8.55% Y and 1.57% Zr. The critical current density of the tape was measured to be 4.37 MA/cm$^2$ at 77 K, 0 T. At 30 K and a 3 T field applied perpendicular to the tape, a lift factor of 1.8 was achieved corresponding to a critical current of 728 A/cm.

What is claimed is:

1. A superconductor tape comprising:
   a lift factor greater than or equal to approximately 3.0 at approximately 30 K in a magnetic field of approximately 3 T having an orientation perpendicular to the tape.

2. The superconductor tape of claim 1, further comprising a barium+dopant content greater than approximately 32.0 atomic %.

3. The superconductor tape of claim 2, further comprising a copper content less than approximately 48.5 atomic % and a rare-earth content between 16.5-19.5 atomic %.

4. The superconductor tape of claim 2, wherein the dopant content is at least approximately 1.65 atomic % and the barium content is at least approximately 29.9 atomic %.

5. The superconductor tape of claim 1, wherein the lift factor is greater than or equal to approximately 4.0 at approximately 30 K in a magnetic field of approximately 3 T having an orientation perpendicular to the tape.

6. The superconductor tape of claim 5, further comprising a barium+dopant content greater than approximately 33.0 atomic % and a rare-earth content between 16.5-19.5 atomic %.

7. The superconductor tape of claim 6, further comprising a copper content less than approximately 49.0 atomic %.

8. The superconductor tape of claim 6, wherein the dopant content is at least approximately 1.65 atomic % and the barium content is at least approximately 30.5 atomic %.

9. The superconductor tape of claim 5, further comprising a barium to barium+dopant+copper ratio greater than approximately 38.0%, a dopant to barium+dopant+copper ratio less than approximately 2.5%, a copper to barium+dopant+copper ratio less than approximately 59.5%, and a rare-earth content between 16.5-19.5 atomic %.

10. The superconductor tape of claim 5, further comprising a barium to copper ratio greater than or equal to approximately 0.62 and a rare-earth content between 16.5-19.5 atomic %.

11. The superconductor tape of claim 5, further comprising a barium+dopant to copper ratio greater than or equal to approximately 0.65 and a rare-earth content between 16.5-19.5 atomic %.

12. The superconductor tape of claim 5, further comprising a critical current density less than or equal to approximately 3.8 MA/cm$^2$ at 77 K in absence of an external magnetic field.

13. The superconductor tape of claim 1, further comprising a barium to barium+dopant+copper ratio greater than approximately 37.5%, a dopant to barium+dopant+copper ratio less than approximately 2.0%, a copper to barium+dopant+copper ratio less than approximately 60.5%, and a rare-earth content between 16.5-19.5 atomic %.

14. The superconductor tape of claim 1, further comprising a barium to copper ratio greater than or equal to approximately 0.58 and a rare-earth content between 16.5-19.5 atomic %.

15. The superconductor tape of claim 1, further comprising a barium+dopant to copper ratio greater than or equal to approximately 0.62 and a rare-earth content between 16.5-19.5 atomic %.

16. The superconductor tape of claim 1, further comprising a critical current density less than or equal to approximately 4.2 MA/cm$^2$ at 77 K in absence of an external magnetic field.

17. The superconductor tape of claim 1, wherein the tape further comprises a critical current greater than 800 A/cm-width in the 3 T magnetic field at 30K.

18. A superconductor tape comprising:
a critical current density greater than approximately 12 MA/cm$^2$ at approximately 30 K in a magnetic field of approximately 3 T having an orientation parallel to the c-axis.

19. The superconductor tape of claim 18, wherein the critical current density is greater than approximately 15 MA/cm$^2$ at approximately 30 K in a magnetic field of approximately 3 T having an orientation parallel to the c-axis.

20. The superconductor tape of claim 18, wherein the superconductor tape comprises a superconductor film having a film thickness of at least approximately 0.9 μm.

21. The superconductor tape of claim 18, wherein the tape further comprises a critical current greater than 800 A/cm-width in the 3 T magnetic field at 30K.

* * * * *